United States Patent [19]

Kleinedler et al.

[11] Patent Number: 4,519,132

[45] Date of Patent: May 28, 1985

[54] HIGH SPEED CONTACT INSERTION FACILITY

[75] Inventors: Gary E. Kleinedler, Hillsborough Township, Somerset County; Herbert A. Pohl, Raritan Township, Hunterdon County, both of N.J.

[73] Assignee: AT&T Technologies, Inc., New York, N.Y.

[21] Appl. No.: 535,465

[22] Filed: Sep. 26, 1983

[51] Int. Cl.[3] .......................... H05K 3/00; B23P 19/02

[52] U.S. Cl. .......................................... 29/845; 29/747

[58] Field of Search ................. 29/844, 845, 842, 847, 29/739, 747, 56.6, 884

[56] References Cited

U.S. PATENT DOCUMENTS

| | | | |
|---|---|---|---|
| 3,852,866 | 12/1974 | Johnson | 29/747 X |
| 4,211,001 | 7/1980 | White et al. | 29/747 |
| 4,365,398 | 12/1982 | Chisholm | 29/845 |
| 4,417,396 | 11/1983 | Ammon et al. | 29/845 X |

*Primary Examiner*—Howard N. Goldberg
*Assistant Examiner*—Carl J. Arbes
*Attorney, Agent, or Firm*—D. J. Kirk

[57] ABSTRACT

A contact insertion machine (50) having a base (52) with an X, Y, $\theta$ table (54) thereon and a superstructure (56) hingeably mounted on the base for movement towards and away from the table (54). The superstructure (56) has a plurality of contact strip feed reels (78) which sequentially feeds the strips (42) to each of a plurality of insertion heads (80). A tray (68) containing a multitude of connector housings (16) is positioned on the X, Y, $\theta$ table (54) and the superstructure (56) moved towards the tray until the heads (80) are in close, spaced relation to the connectors in the tray. The heads (80) are activated to simultaneously insert a contact (30) into each of a plurality of different connector housings (16). The contacts (30) are simultaneously inserted sequentially into a different sector of connectors until contacts have been inserted into predetermined cavities 28—28 in the connector housings (16).

4 Claims, 24 Drawing Figures

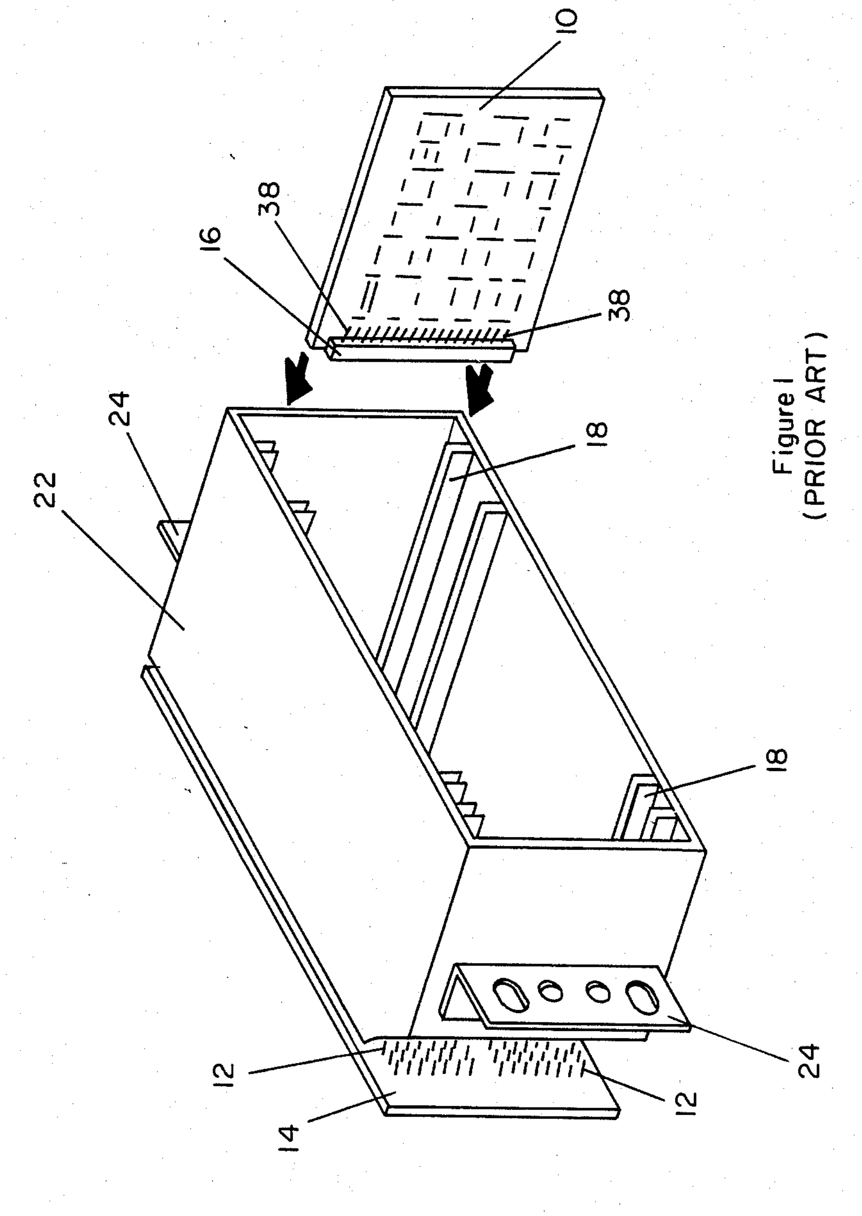
Figure I
(PRIOR ART)

HIGH SPEED CONTACT INSERTION FACILITY

TECHNICAL FIELD

The instant invention is related to the high speed insertion of electrical contacts into connector housings.

BACKGROUND OF THE INVENTION

It is well known to connect printed wiring boards (PWB's) to a backplane having a multitude of pins projecting therefrom. This is typically accomplished using a connector comprised of a molded insulator housing having a plurality of cavities, each cavity having an elongated metal contact inserted therein. The connector is affixed to the PWB by staking or other fastening means and portions of the contacts projecting from the connector are soldered to the board. The PWB with the connector thereon is urged towards the backplane to insert a plurality of pins into the appropriate contacts of the connector.

The elongated metal contacts, stamped and formed from 0.010 inch thick stock in high speed punch presses, are not severed from the raw material strip during their passage through a progressive punch and die. Instead, the contacts depend from a continuous spine by means of narrow support stems. Accordingly, the input to the contact insertion machine is in the form of coils of such contacts.

Typically, the contacts may be cut from the spines and placed in a vibratory feeder apparatus. The contacts are then fed into the cavities in the connector housing and a punch is urged downward to insert the contact into the connector cavity. A further technique is to fill a magazine or boot with a plurality of contacts which is placed over a connector housing and the contacts simultaneously urged into the connector cavities. It is also known to feed a single strip of contacts depending from a continuous spine to an insertion head having two punches. The contacts are pushed away from the spine which deforms the upper portion of the contact which is then cut. The two punches then are moved downward to insert two contacts into alternate cavities in the connector housing. Such prior art insertion machines are relatively slow in operation and have been found to have substantial downtime.

Accordingly, there is a need for high speed contact insertion equipment having minimal downtime which can insert elongated contacts into connector housings.

SUMMARY OF THE INVENTION

The instant invention overcomes the foregoing problem with a method of inserting elongated contacts into cavities of connector housings. The method comprises the steps of positioning the housings in a planar array on an indexable table; simultaneously indexing a plurality of strips of contacts past a respective plurality of contact insertion heads; simultaneously activating the insertion heads to insert a contact from each strip into a cavity of a different connector housing in the array; and continuously indexing the array of connector housings and inserting contacts into cavities therein until contacts have been inserted into predetermined cavities of the connector housings.

BRIEF DESCRIPTION OF THE DRAWINGS

FIG. 1 is an isometric view of a PWB shelf assembly;

DETAILED DESCRIPTION

FIG. 1 depicts a typical arrangement for electrically connecting a PWB 10 to a multitude of electrically conductive contact pins 12—12 on a backplane 14. The PWB 10 having a connector 16 affixed to one edge is urged along a pair of opposed rails 18—18 located inside a mounting shelf 22 which is affixed to a frame support (not shown) using brackets 24—24. Once fully inserted into the shelf 22 the pins 12 are slideably captured in contacts (not shown) within the connector 16.

Figure 3:
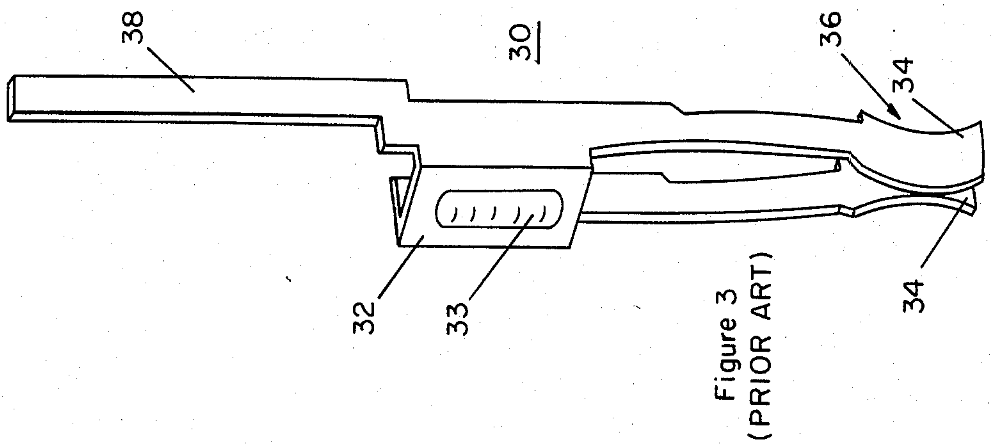
Figure 3 (PRIOR ART)
FIG. 3 is an isometric view of a contact.
Figure 2:
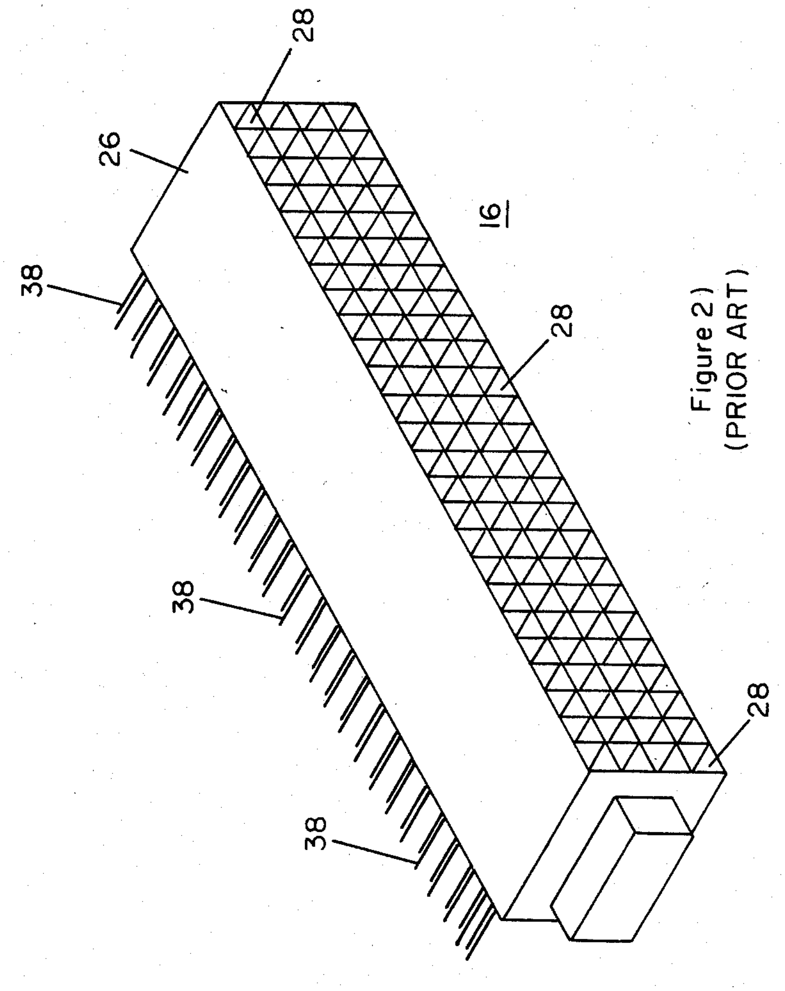
Figure 2 (PRIOR ART)
FIG. 2 is an isometric view of a molded insulator connector housing.
Figure 4:
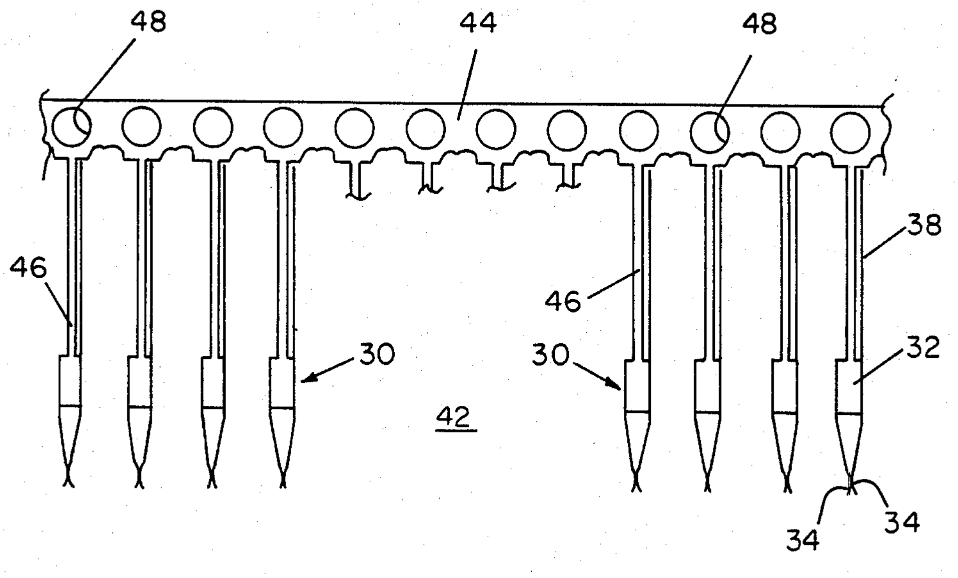
Figure 4 (PRIOR ART)
FIG. 4 depicts a strip of contacts.

Although there are many variations as to the size and the number of contacts, such connectors 16 have the same basic structure (see FIG. 2) comprised of a molded plastic insulator housing 26 having a matrix of square cavities 28—28 on approximately 0.125 inch centers. A metal contact 30, as shown in FIG. 3 (not to scale), is press fit into each of the apertures 28—28. The contact 30 has a "U" shaped central body portion 32 having a protrusion 33 and a pair of opposed, curved, tines 34—34 depending from one end thereof to form a spreadable "duck-bill" 36 into which contact pins 12—12 from the backplane 14 (see FIG. 1) are slideably captured. An electrically conductive tail 38 extends from the other end of the body portion 32 and projects from the connector housing 26 when the contact 30 has been properly inserted therein (see FIG. 2). Contacts 30 normally are purchased by the reel wherein a strip 42 of contacts (see FIG. 4) are punched and formed. Each contact 30 is connected to a spine 44 by a support member 46. The spine 44 has a plurality of spaced openings 48—48 therein.

The tails 38, extending from the connector 16, are soldered to land areas on the PWB 10, as shown in FIG. 1, to form an electrical and mechanical connection therebetween. Advantageously, such a connector 16 permits substantially more I/0 connections along the edge of the PWB 10 than earlier connectors. The connectors 16 have connection densities ranging from 16 to 48 contacts 30 per inch of PWB 10 width with the inserted contacts spaced on 0.125 inch centers. This type of connector 16 appears to offer the best solution to the problem of meeting the high I/0 requirements that the latest PWB's 10 present.

The use of such connectors 16 has been predicted to increase dramatically in the coming years. Therefore, there is a need for a high speed insertion facility that can operate substantially continuously with minimum downtime and has the capability of inserting contacts 30—30 in different size connectors 16—16.

Figure 5:
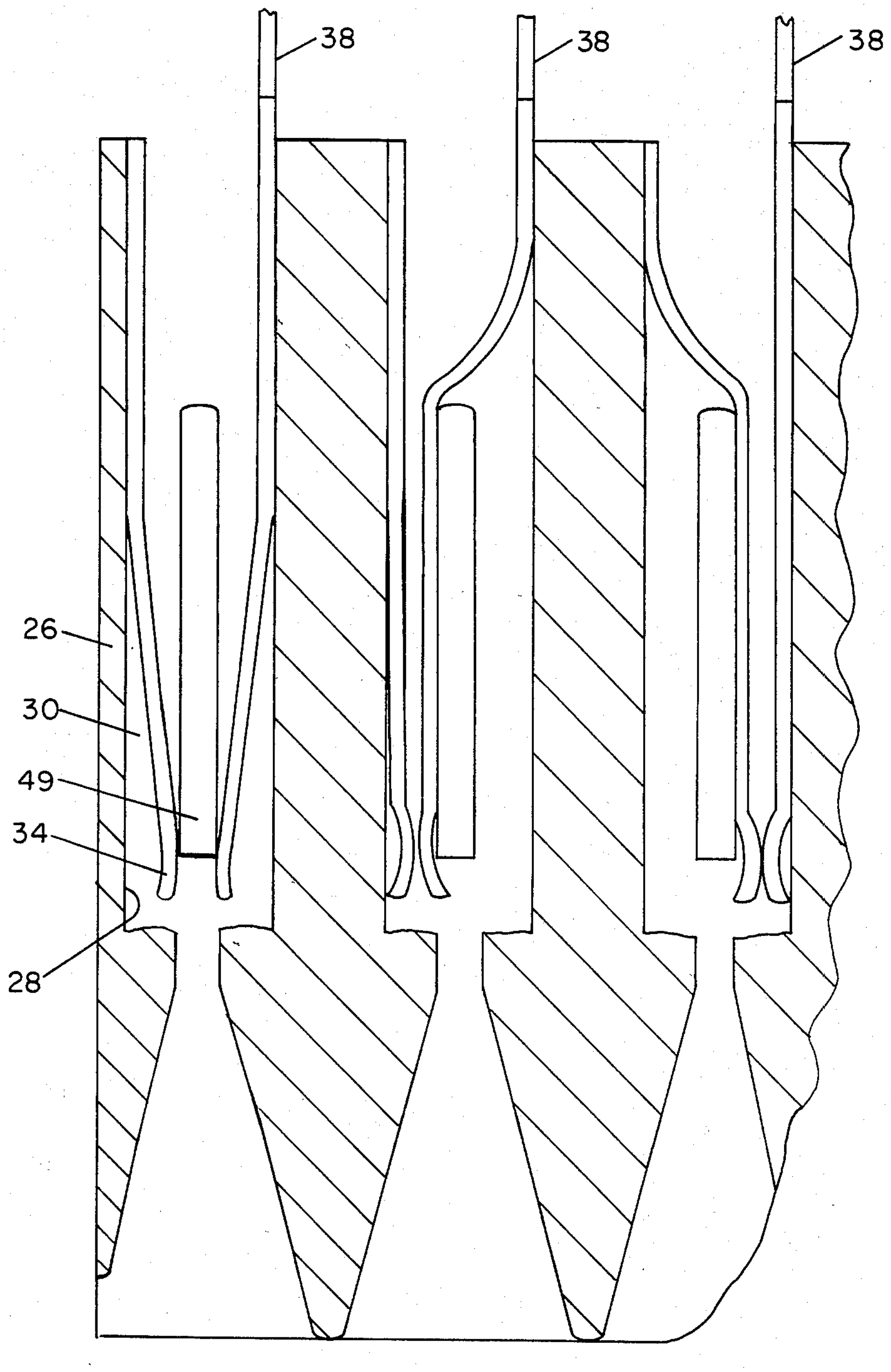
FIG. 5 is a cross-sectional view of a connector with contacts inserted therein.

Additionally, one of the most costly defects to repair is a "black eye" insertion where both tines 34—34 of the contact 30 are located on one side or the other of a molded rib 49 on the inside surface of the cavities 28—28 of the connector 16. FIG. 5 shows a properly inserted contact 30 (left side) with the tines 34—34 straddling and being held apart by the rib 49. Contacts 30 shown in the center and right of the figure are improperly inserted and must be removed manually and reinserted or replaced. Such a defect can be observed visually by holding the connector 16 near a light source and looking into the cavities 28—28. Some light passes through the cavity 28 when the contact 30 is properly positioned while no light passes through the cavity 28 when the contact 30 is improperly positioned.

Figure 6:
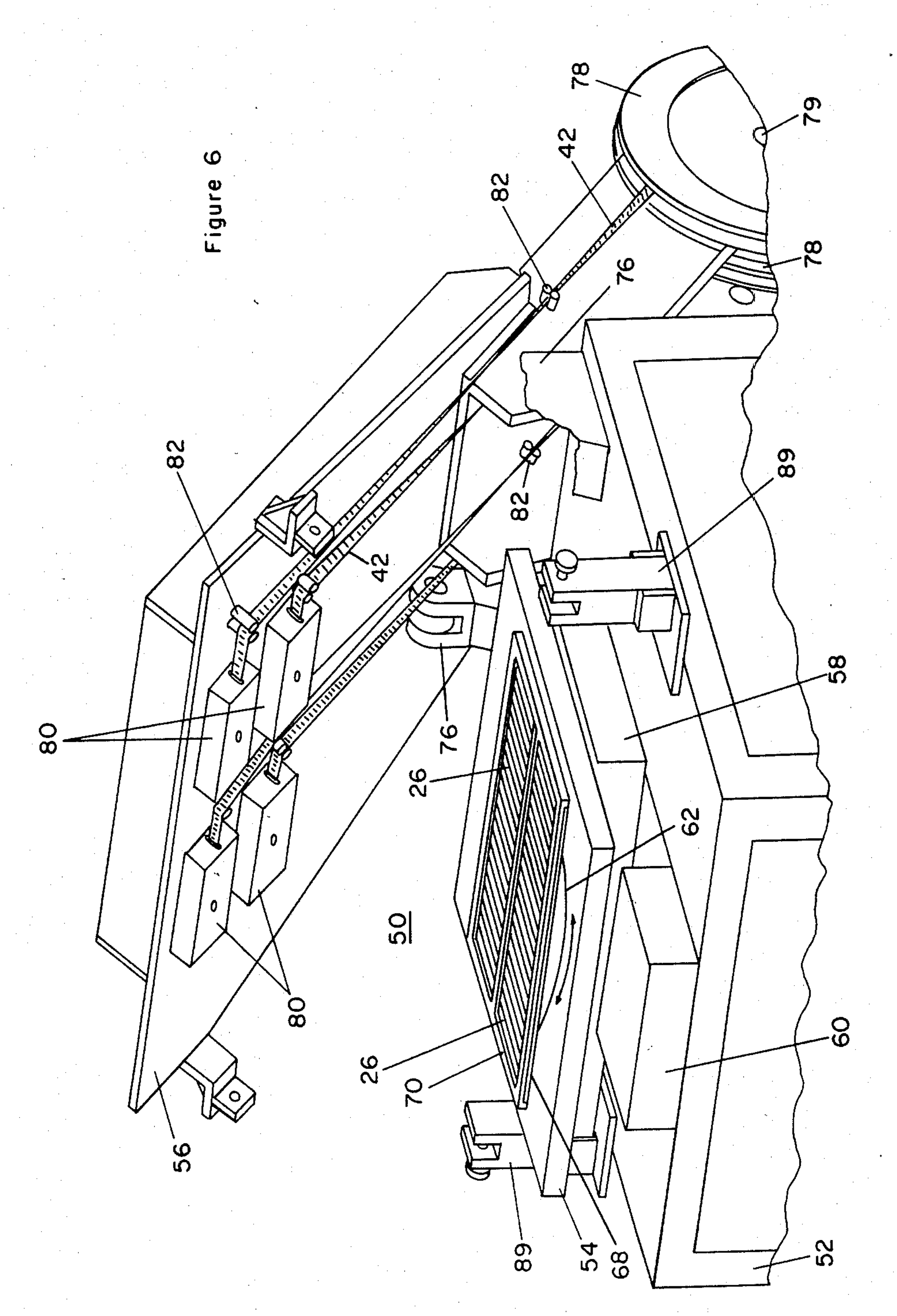
FIGS. 6 and 7 are isometric views of a contact insertion machine.
Figure 7:
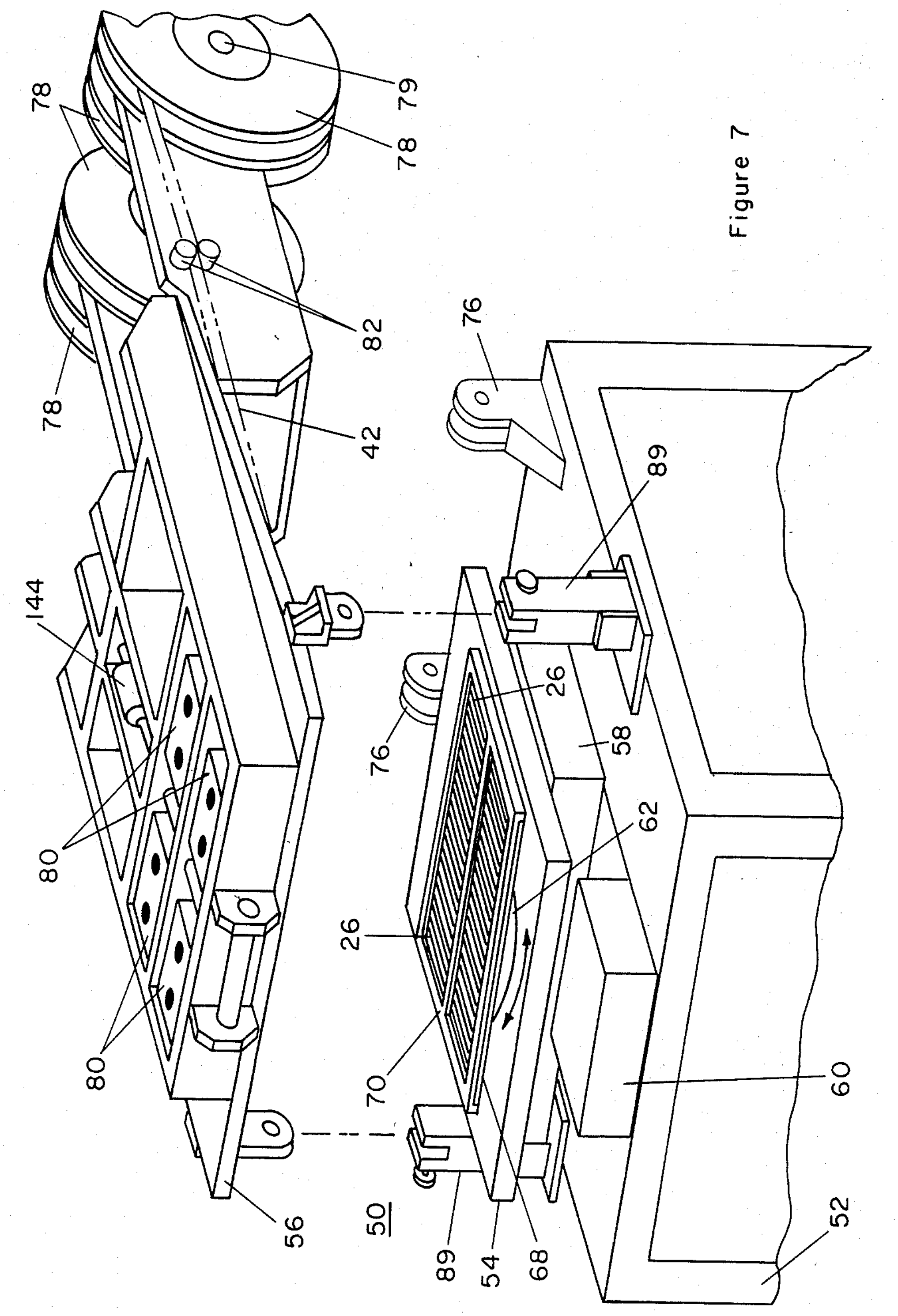
Figure 23:
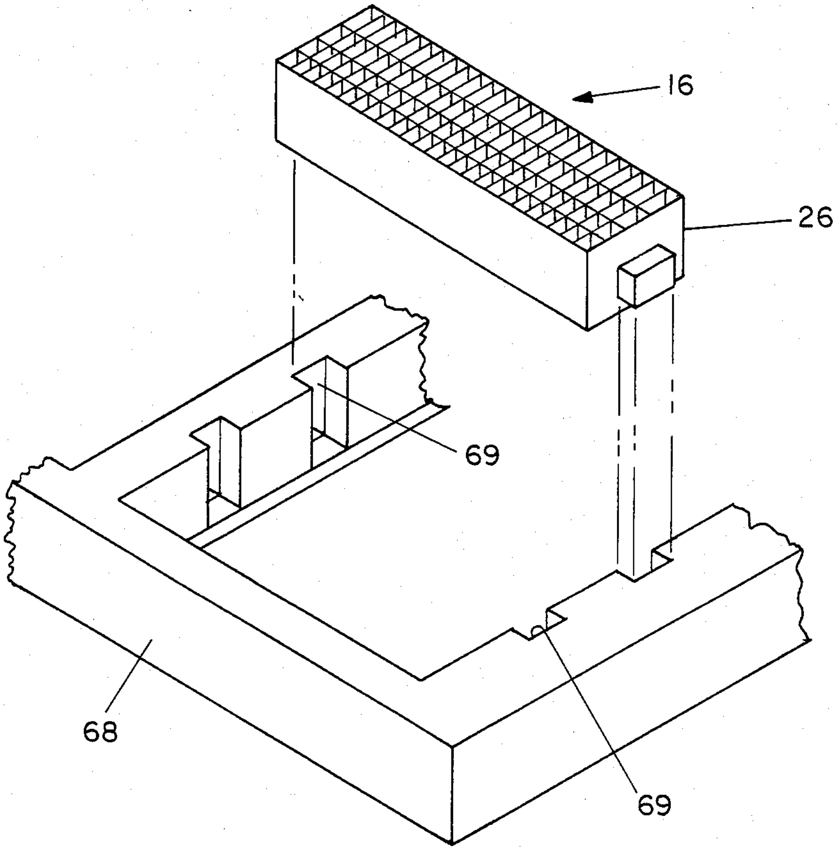
FIG. 23 depicts a partial isometric view of a tray for holding connectors.

FIGS. 6 and 7 are isometric and exploded views, respectively, of the instant contact insertion machine 50. The machine 50 is comprised of a base 2, an X, Y, $\theta$ table 54 and a rotatably mounted superstructure 56. The X, Y, $\theta$ table 54 has an X movement mechanism 58 and a Y movement mechanism 60 to control the movement of the table 54 in a well known manner under computer control apparatus (not shown). Additionally, a substantially circular plate 62 is positioned in the central portion of the table 54 and is rotatable via the computer control apparatus (not shown). A tray 68 (also see a partial view in FIG. 23) having a multitude of connector housings 16—16 therein is placed on the plate 62 with locating pins (not shown) projecting into the underside of the housings for accurate positional alignment. The ends of each connector 16 fit loosely into cutouts 69—69 in the tray 68. A locking frame 70 is placed on top of the tray 68 and fixedly held in place using latches and locking members (not shown) to hold the connector housings 26—26 securely in place.

The superstructure 56 is pivotably mounted at hinges 76—76. Four reels 78—78 of contact strips 42—42 are rotatably mounted on a shaft 79 at one end of the superstructure 56. The strips 42—42 are individually guided into each of a plurality of contact insertion heads 80—80 (shown schematically in FIG. 7) using a plurality of pinwheels 82—82. Scrap residue passing from the heads 80—80 may be directed through guide channels (not shown) to an appropriate receptacle. A locking mechanism 89 is fixedly mounted on the base 52 to lock the superstructure 56 in place during operation.

Figure 8:
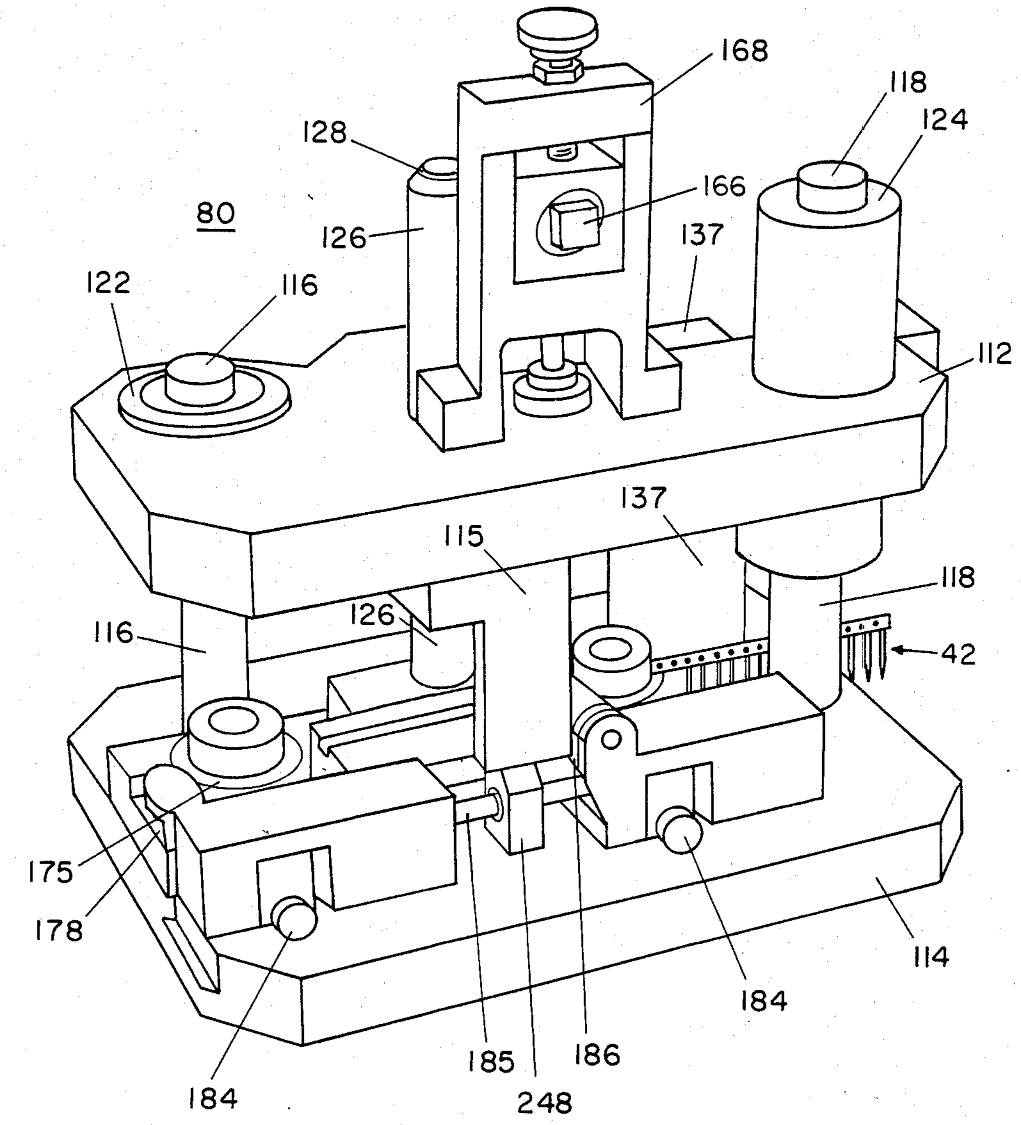
FIGS. 8 and 9 are isometric and side views, respectively, of the instant contact insertion head.
Figure 9:
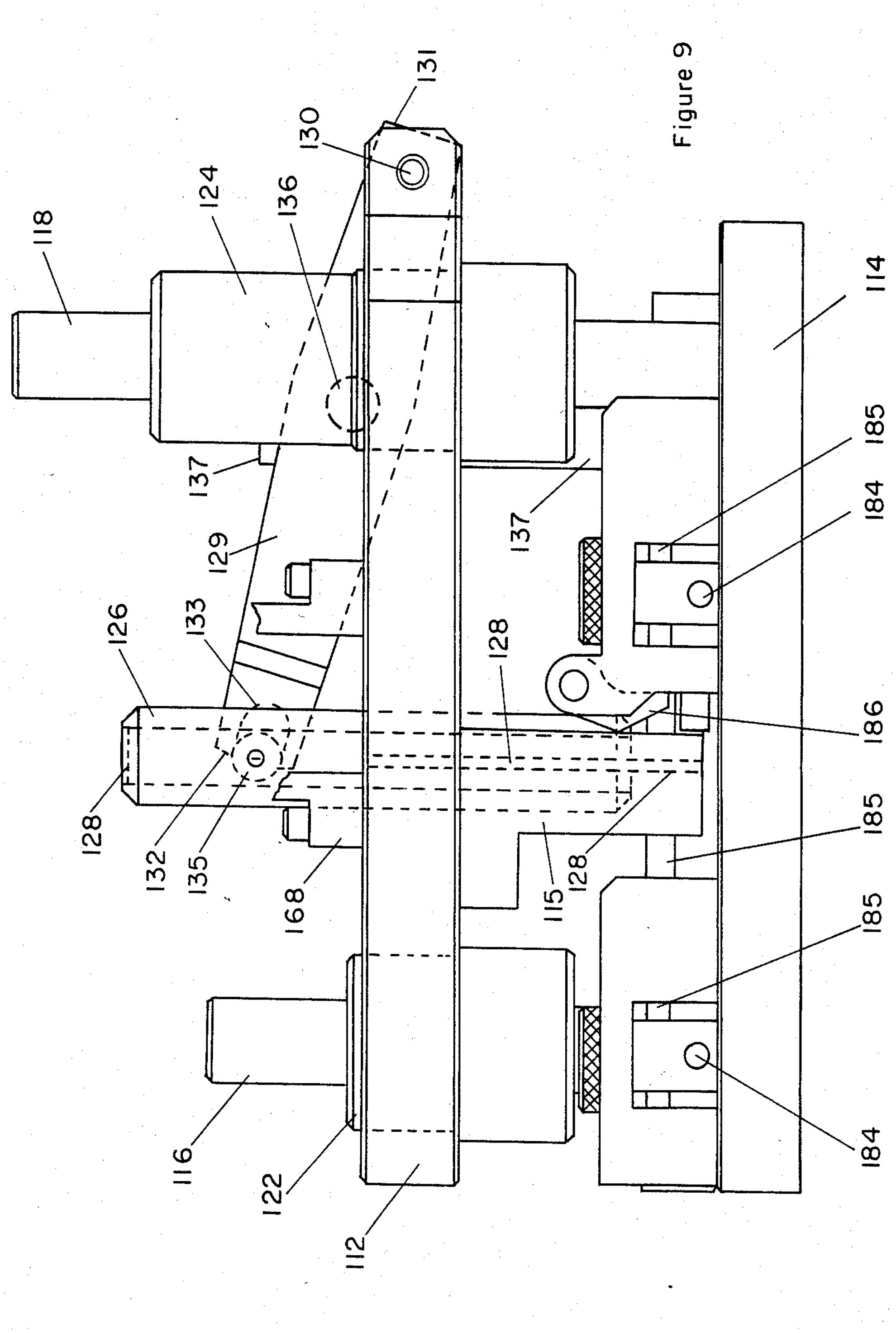
Figure 10:
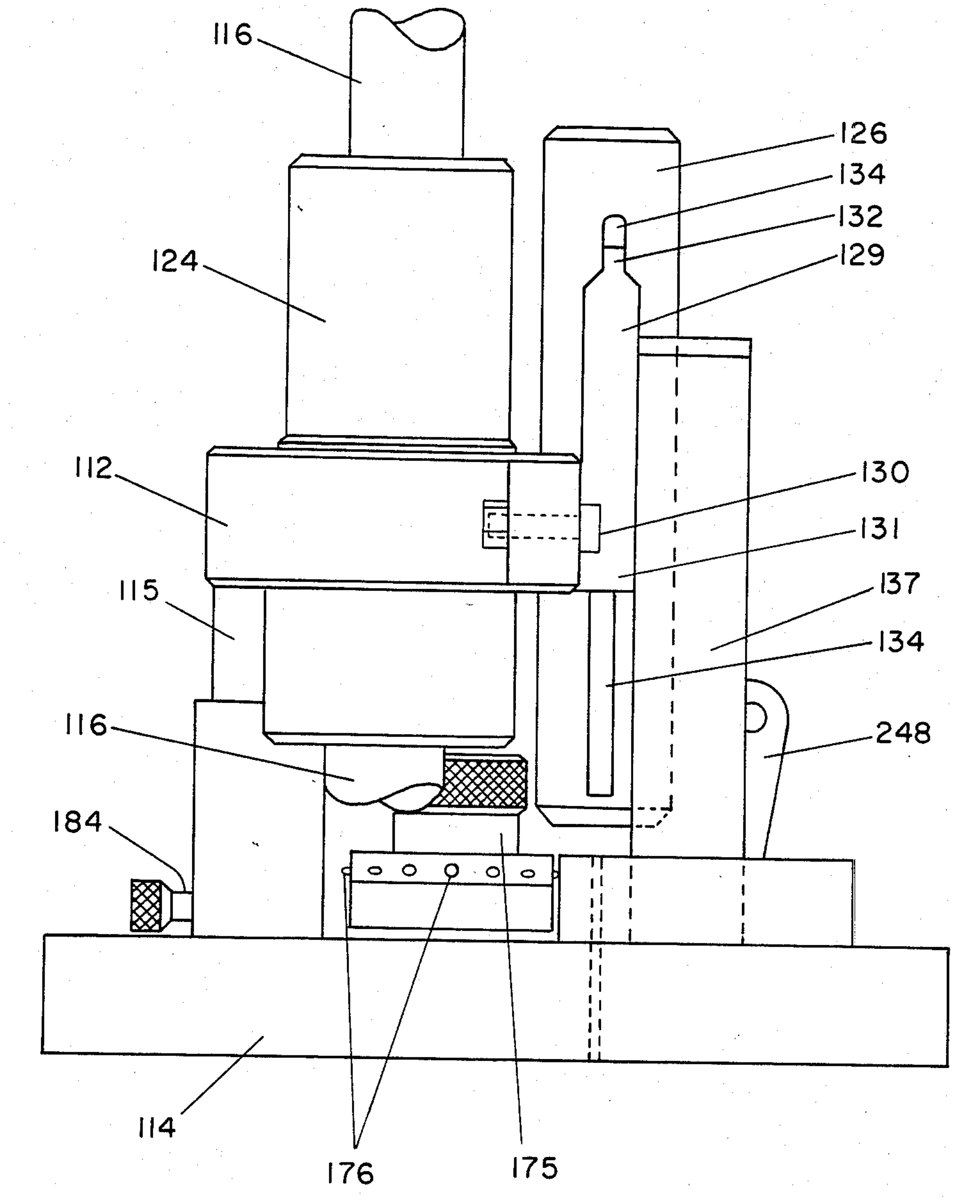
FIG. 10 is an end view of the contact insertion head.

Each insertion head 80 (see FIGS. 8 and 9) has upper and lower plates 112 and 114, respectively. The upper plate 112 is movably mounted on first and second shafts 116 and 118, respectively, using linear bearings 122 and 124, respectively. The shafts 116 and 118 are fixedly mounted on the bottom plate 114 and a cam 115 is fastened to the underside of the top plate 112. The bottom plate 114 is fixedly attached to the superstructure 56 of the machine 50 during the contact insertion operation. A cylindrical punch housing 126 is fixedly mounted on, and extends through, the upper plate 112. A punch 128 is slideably mounted within the housing 126. A lever arm 129 (see FIG. 9) is pivotably connected to the upper plate 112 by a pivot pin 130 at a first end 131 thereof. The second end 132 of the arm 129 has an indentation 133 (see FIG. 9) therein which extends into the punch housing 126 through a longitudinal slot 134 (see FIG. 10) to capture a pin 135 (see FIG. 8) located within a slotted opening in the punch 128. A rotatable shaft 136 extending from a support means 137, which is fixedly mounted to the lower plate 114, passes through the arm 129 at a location intermediate to the first and second ends 131 and 132, respectively.

Figure 11:
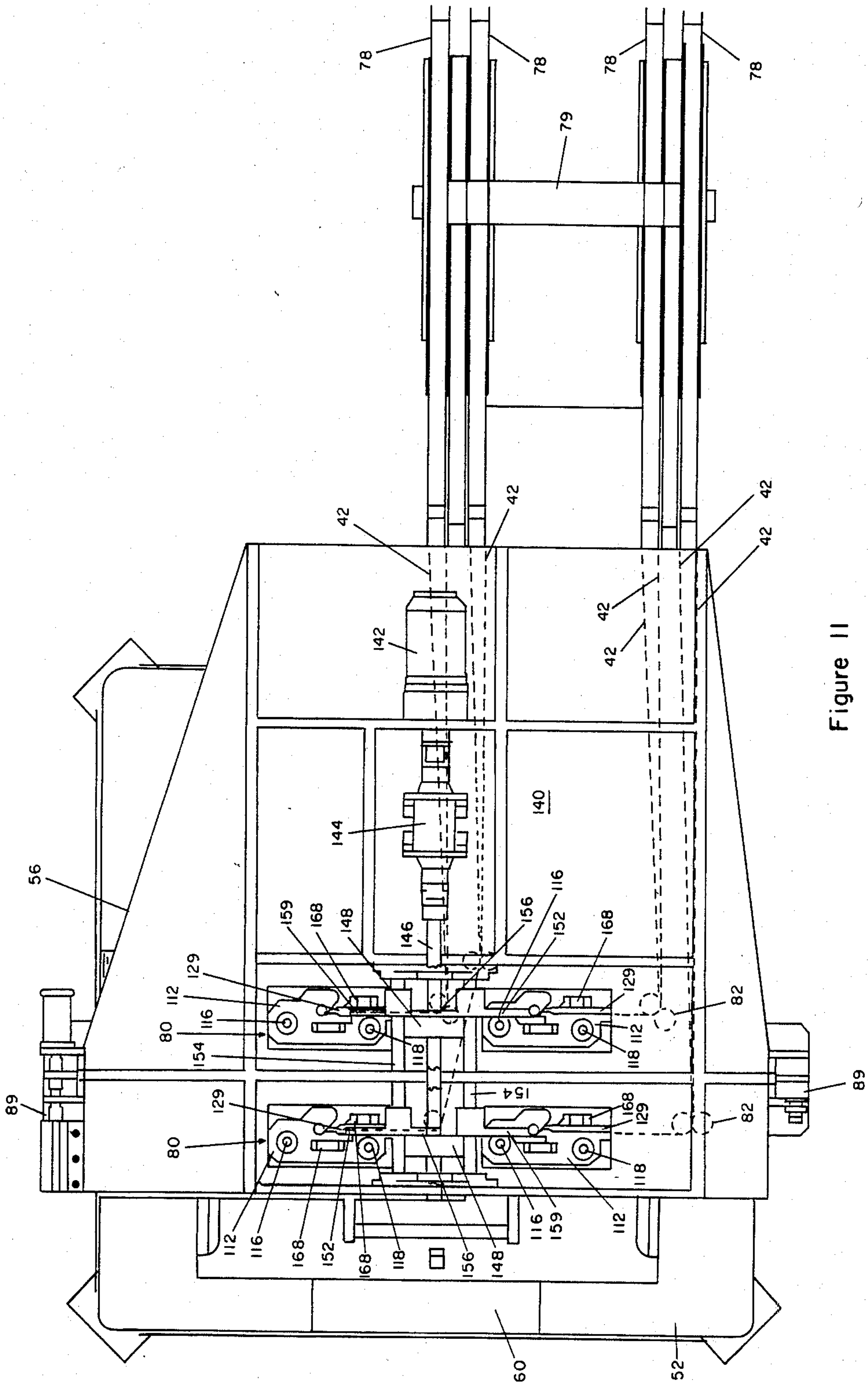
FIG. 11 is a plan view of the insertion head drive mechanism.
Figure 12:
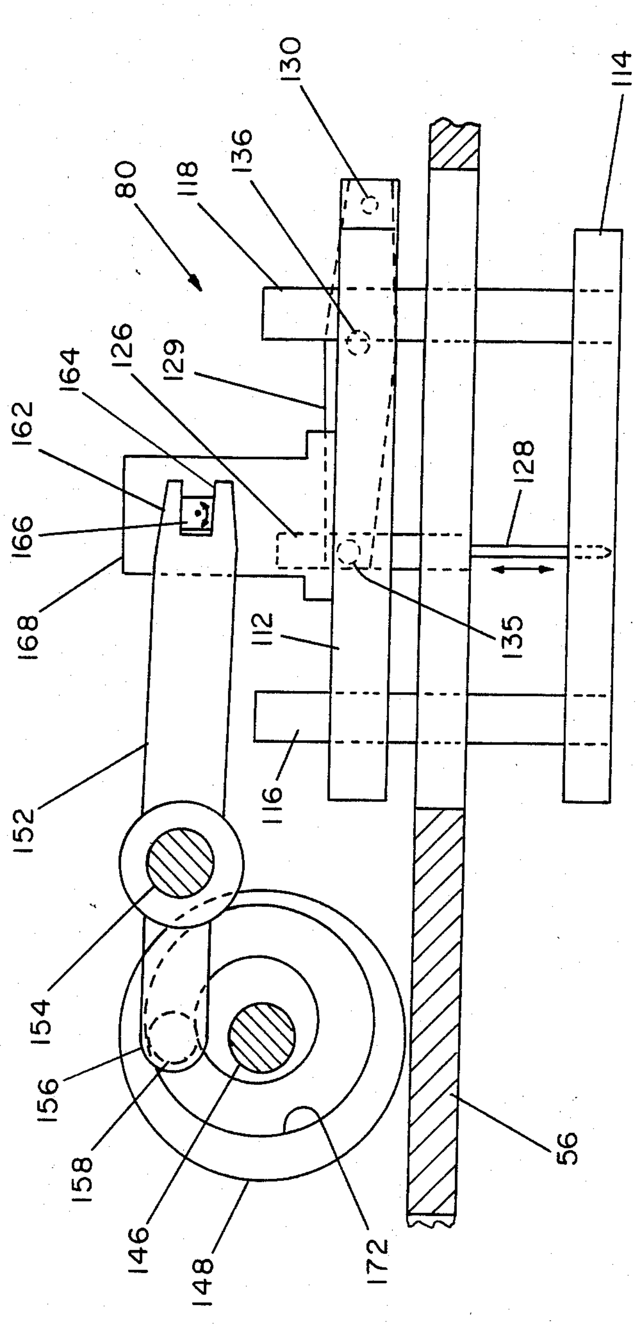
FIG. 12 is a schematic representation of the insertion head drive mechanism.

The movement of the upper plate 112 along the shafts 116 and 118 is accomplished by a drive system 140 located on the superstructure 56 and which can best be seen in the top view of the machine 50 shown in FIG. 11 and the partial cross-sectional schematic view of FIG. 12. The drive system 140 is comprised of D.C. motor 142 connected to a power source (not shown), a clutch-brake 144, a rotatable drive shaft 146 having first and second cylindrical cams 148—148 mounted thereon, a first pair of rocker arms 152—152 each mounted on shafts 154—154. A second pair of rocker arms 159—159 is also connected to, and driven by, the shafts 154—154. A first end 156 of each rocker arm 152 has a cam follower 158 communicating with the cylindrical cam 148 as shown schematically in FIG. 12. The second ends 162 of the rocker arms 152 and ends of rocker arms 159—159 have slots 164—164 which engage a pivotable member 166 mounted in a height adjusting bracket 168 fastened to the upper plate 112.

In operation (see FIG. 11), the D.C. motor 142 is activated by a power source (not shown) to rotate the drive shaft 146 via the clutch-brake 144. The clutch-brake 144 permits the rotation of the drive shaft 146 to be started and stopped to suit the contact insertion sequence. While the D.C. motor 142, coupled to the clutch-brake 144, will run continuously, the insertion head 80 must be stopped when no contacts 30—30 are required to be inserted at predetermined locations. This may occur in the mid-portion of the molded insulator housings 26—26 and when moving from one insulator housing to another.

FIG. 12 schematically depicts the operation of one insertion head 80 of the drive system 140. As the drive shaft 146 rotates the cam 148, the cam follower 158 moves along a track 172 therein causing the second end 162 of the rocker arm 152 to transfer an up and down motion to the upper plate 112 via the height adjusting bracket 168. The upward movement of the upper plate 112 causes the lever arm 129 to pivot on the shaft 136 causing the punch 128 to be moved down, through the lower plate 114 to insert a contact 30 into a connector housing 26 (not shown). As the upper plate 112 moves down the punch 128 will move up into housing 126.

Figure 13:
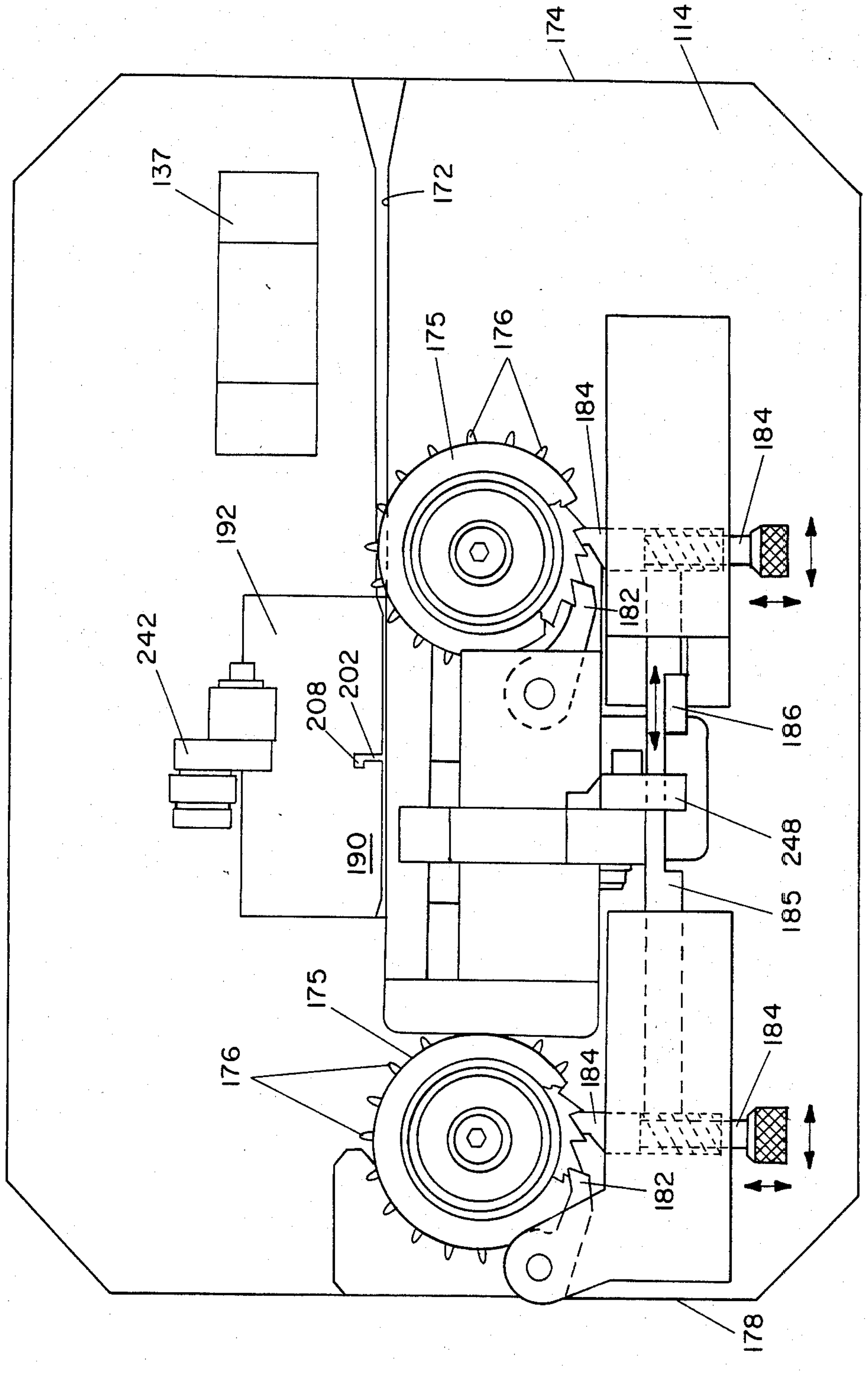
FIG. 13 is a plan view of the lower plate of the insertion head.
Figure 14:
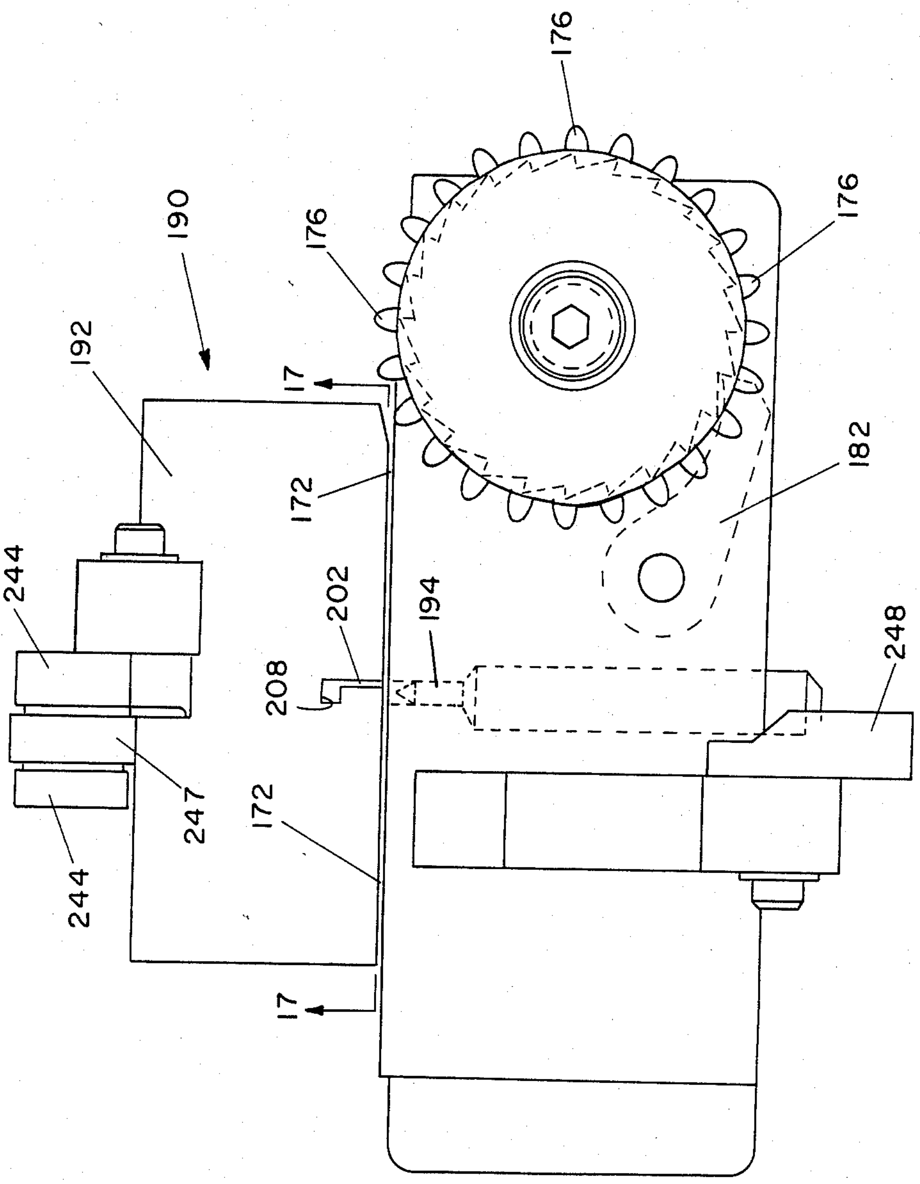
FIG. 14 is a partial plan view of the cut and transfer station.

A plan view of the lower plate 114 is shown in FIG. 13. A contact strip 42 feeder slot 172 enters from one side 174 of the lower plate 114, passes by first and second ratchet wheels 175, having pins 176 on an upper portion thereof, and terminates at the other side 178. Each ratchet wheel 175 has an associated spring biased stop lever 182 and is indexed by a pin 184 which is activated by a shaft 185 in contact therewith which is moved laterally by a lever 186 (also see FIG. 8) that is activated by the downward movement of the cam 115. In operation, a contact strip 42 (see FIG. 4) is placed in the feeder slot 172 and moved past the ratchet wheels 175 until the pins 176 fall into the openings 48 in the spine 44. The pins 184 are then indexed to the right, as seen in FIG. 13, under the control of the shaft 185 to index the ratchet wheels 175—175 in a counterclockwise direction. The wheels 175—175, in turn, index the contact strip 42, to the left, to place the next contact 30 to be processed at a cut and transfer station 190 and is best seen in FIG. 14 which is a plan view of a portion of the apparatus on the lower plate 114.

Figure 15:
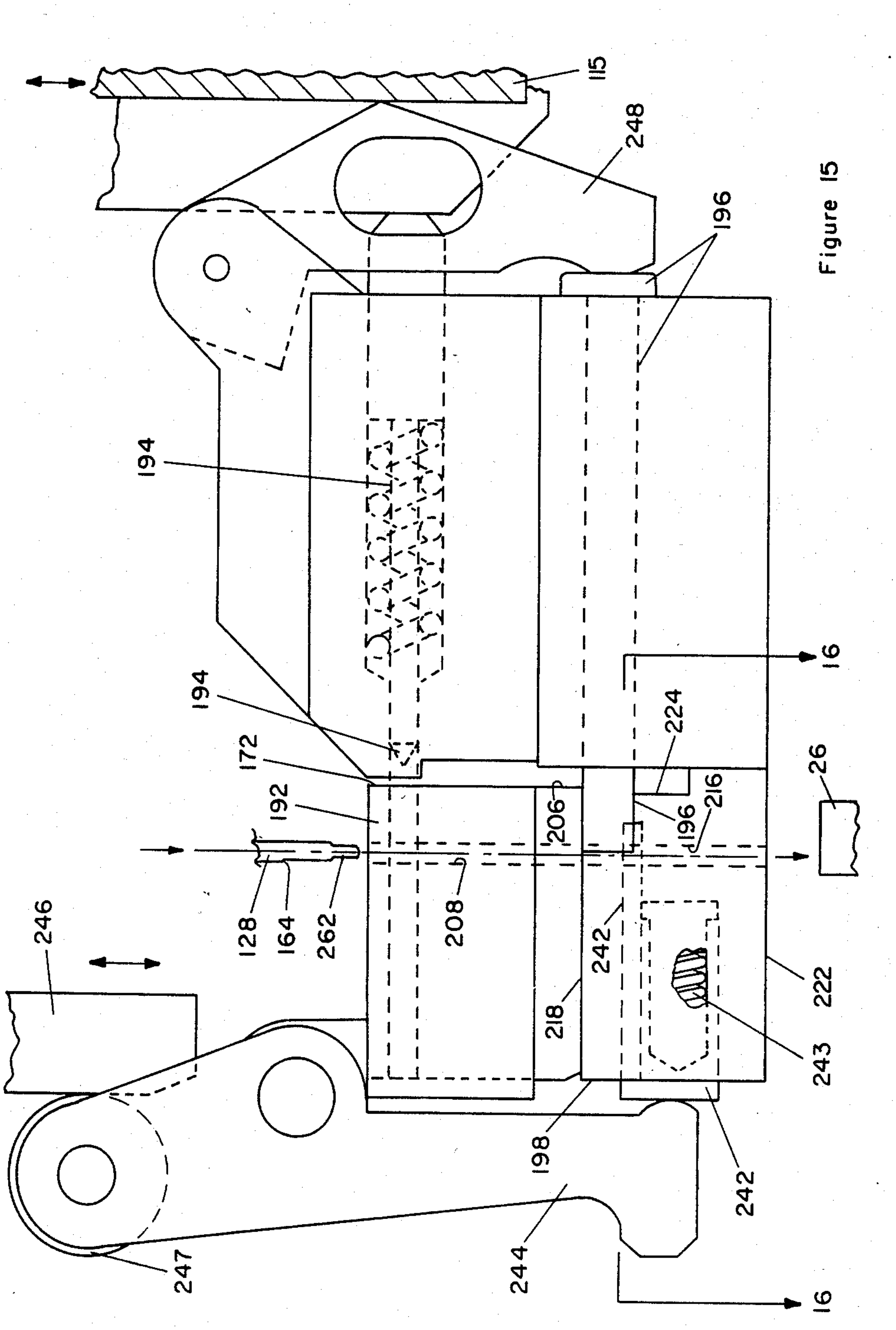
FIGS. 15 to 17 are partial cross-sectional views of the cut and transfer station.
Figure 16:
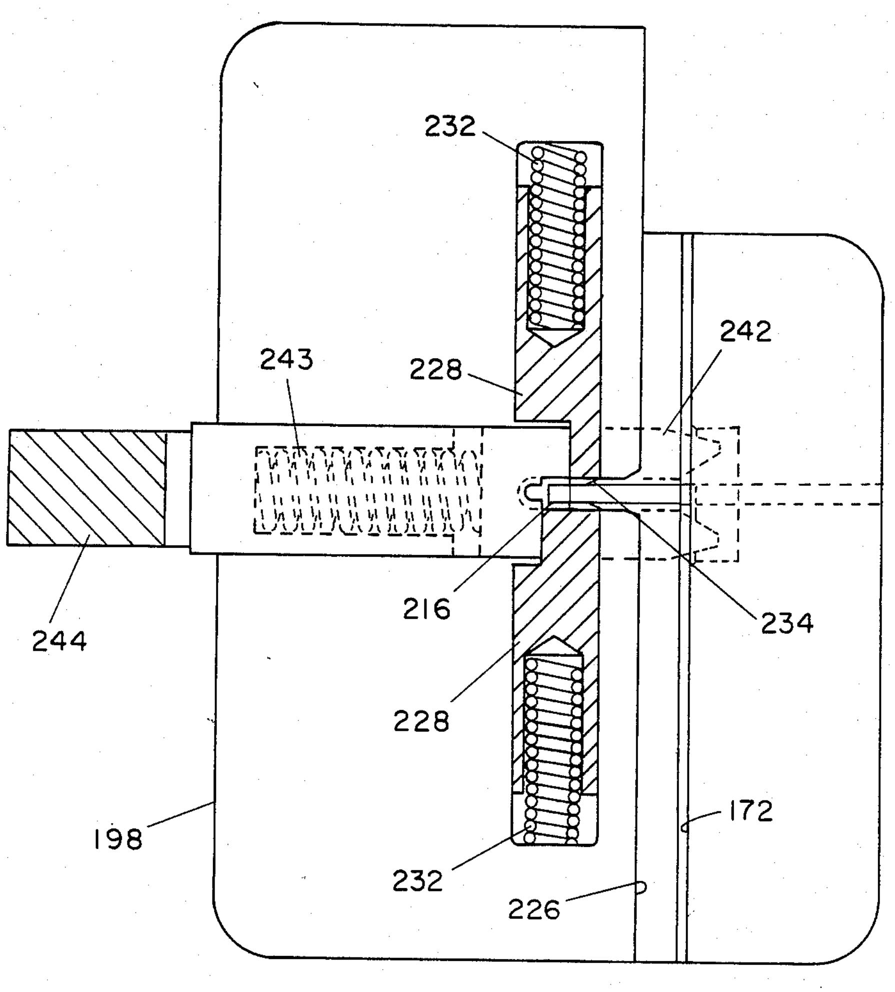
Figure 17:
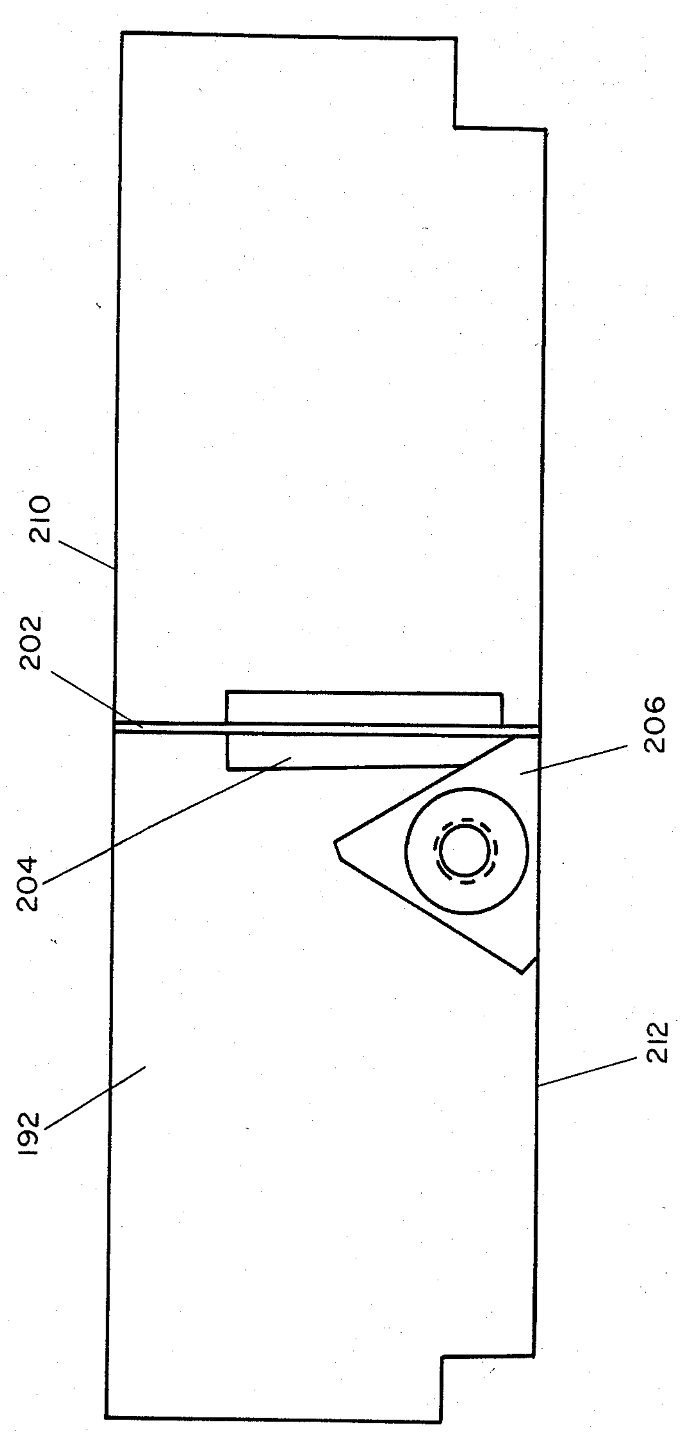
Figure 18:
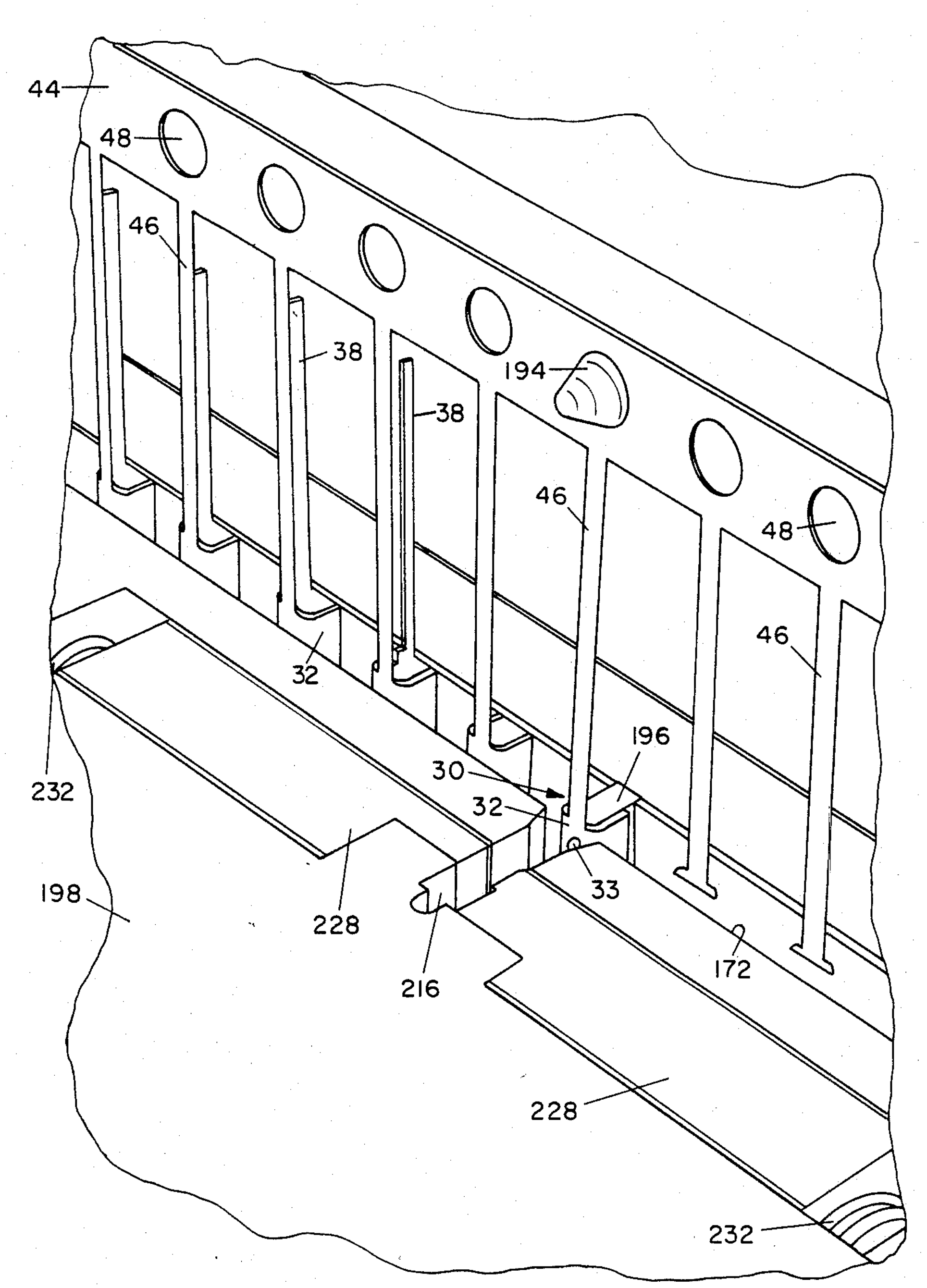
FIGS. 18 to 22 depict steps of the contact insertion operation.

The cut and transfer station 190 is further shown in detail in the various views of FIGS. 15 to 17. FIG. 15 is a side elevation of the cut and transfer station 190 which comprises a die member 192, a spring biased alignment pin 194, and a cut and transfer tool 196 which is attached to the top surface of a base member 198. The die member 192, shown in FIG. 17 in the plane 17—17 indicated in FIG. 14, is a metallic block of material which is fastened to the base member 198. The die member 192 has a narrow slot 202 cut therein with a tapered opening section 204 and a cutting blade 206 located proximate the lower end of the narrow slot. The narrow slot 202 terminates in a substantially square opening 208 that extends from the top 210 to the bottom 212 of the die member 192 as can best be seen in FIG. 14.

The base member 198 (see FIGS. 15 and 16) has an elongated slot 216 extending from the top 218 to the bottom 222 surfaces thereof with a tapered opening 224 in the sidewall 226 thereof. A pair of clamping members 228—228 are laterally disposed to the slot 216 and biased inwardly by springs 232—232. Each of the members 228—228 have a lip 234 extending from one end thereof into the slot 216. An arm 242 having a bifurcated end is biased by a spring 243 and is slideably mounted for movement towards and away from the elongated slot 216 within the base member 198. The movement of the arm 242 is controlled by a lever 244 which is activated by a cam 246 coming in contact with a bearing 247 as can best be seen in FIG. 15.

In operation as shown in FIGS. 14 to 17, the strip 42 of contacts 30 (not shown) is indexed along the feeder slot 172 as hereinbefore described. After each incremental indexing of the strip 42, as hereinbefore described, the alignment pin 194 is urged forward by the downward movement of the cam 115 (see FIG. 15). The pin 194 enters an opening 48 in the spine 44 of the strip 42 to accurately align the next contact 30 depending therefrom with the slots 202 and 216 in the die member 192 and the base 198, respectively. Also, at this time the bifurcated arm 242 (see FIG. 16) is urged toward the contact 30 to position it in front of the transfer tool 196 prior to cutting the contact from the strip 42.

Figure 19:
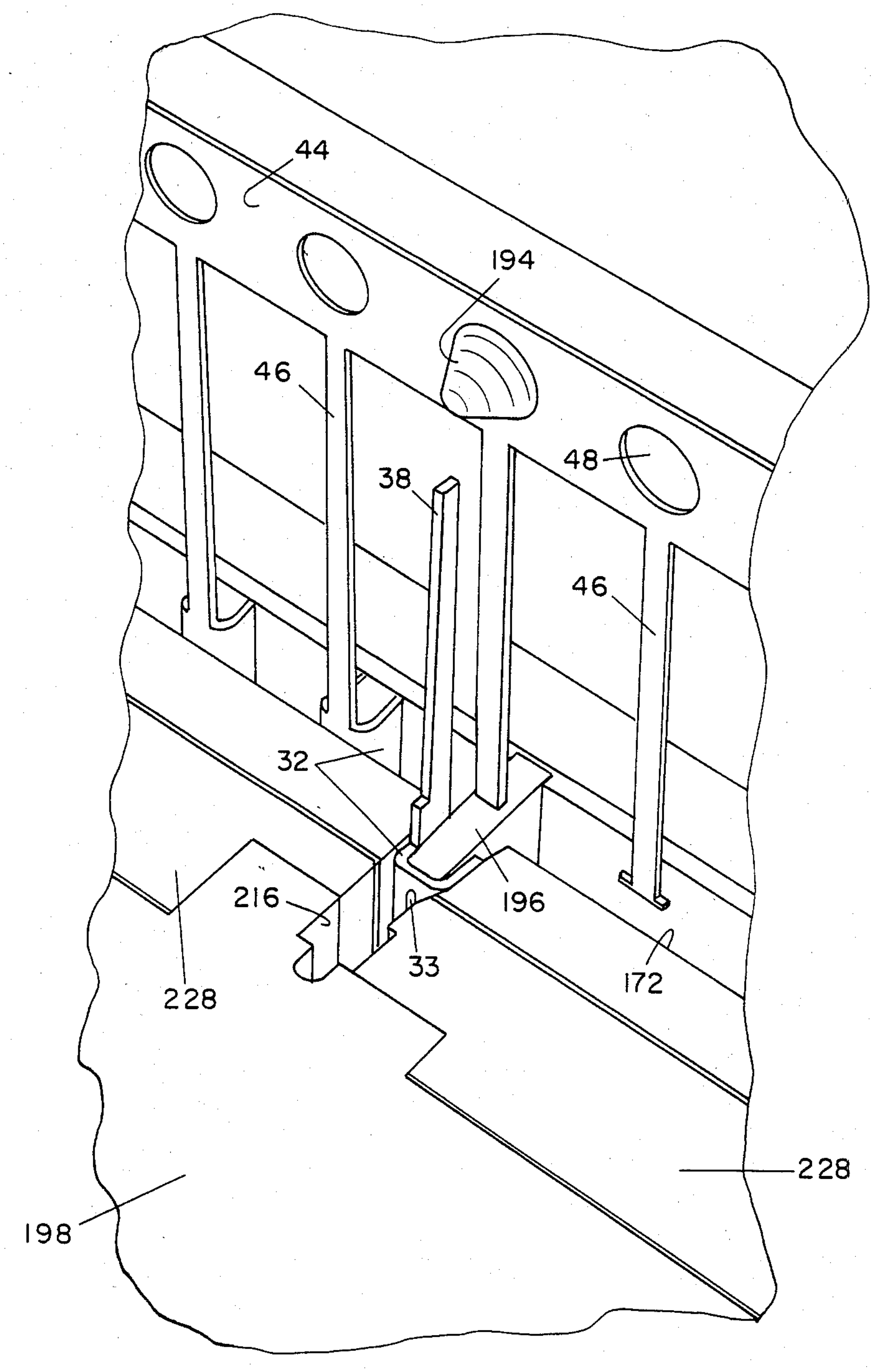
Figure 20:
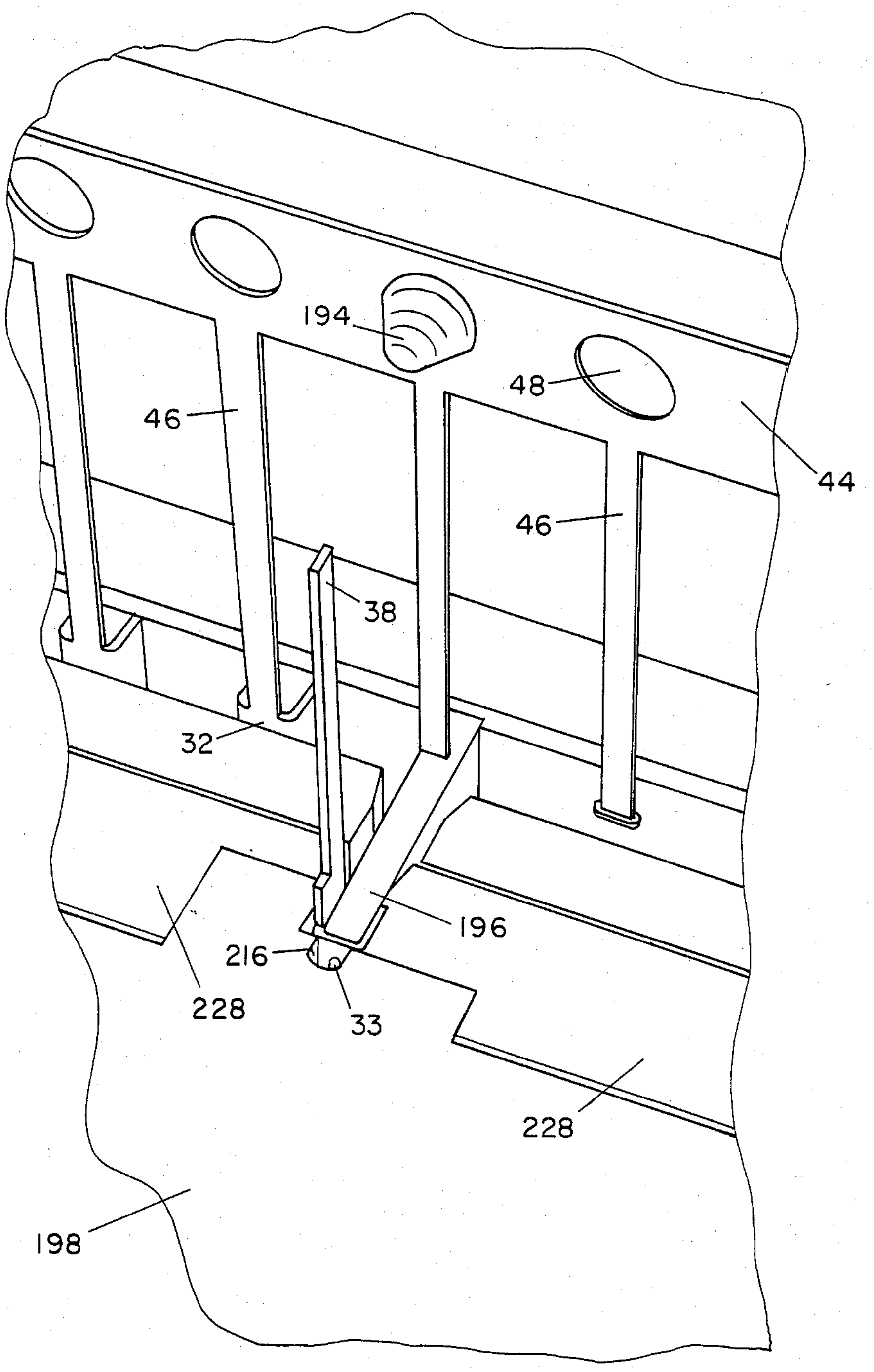
Figure 21:
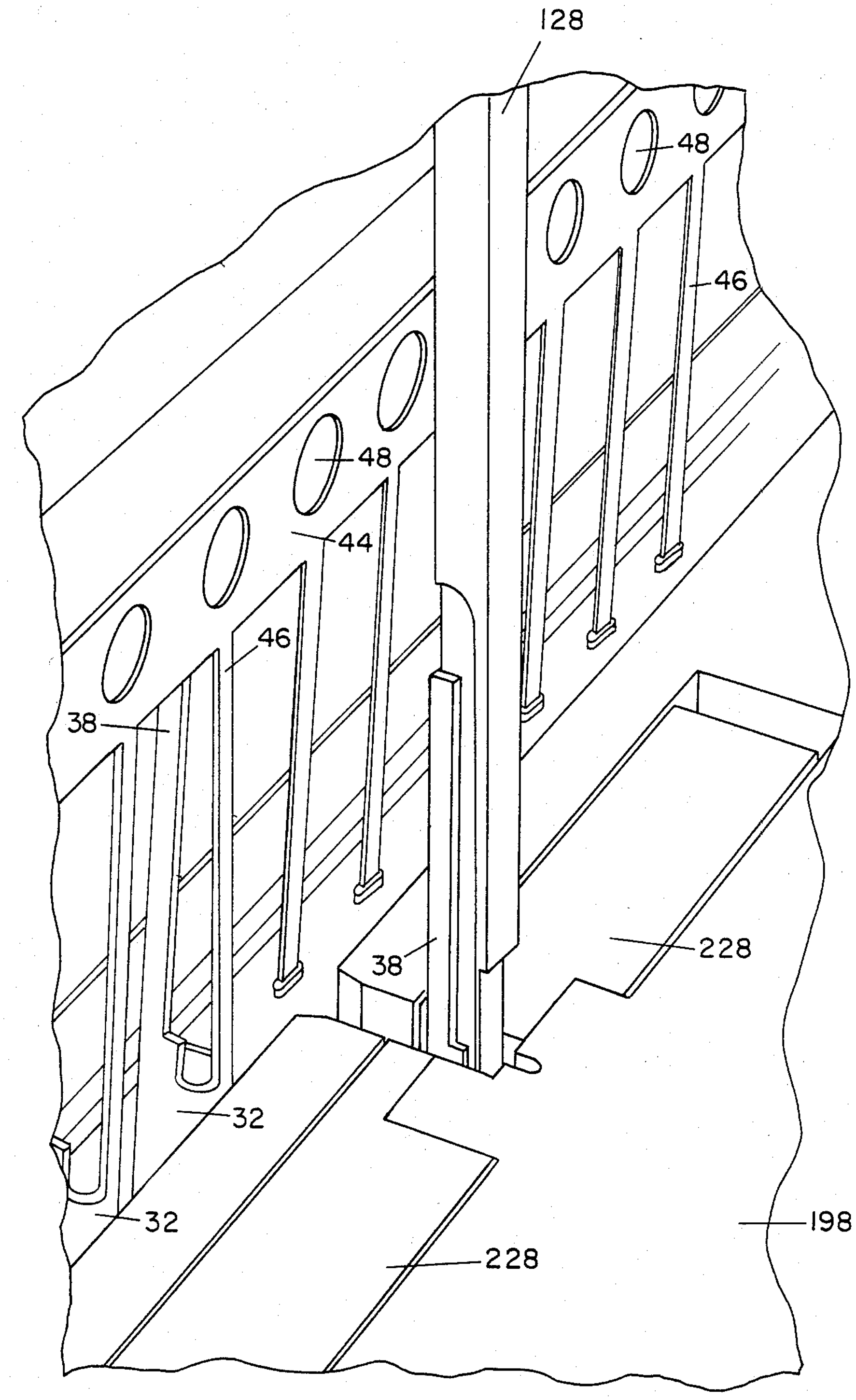

FIGS. 18 to 22 depict the contact cutting, transferring and inserting operations. For purposes of clarity the die member 192 has been removed in those figures to expose the top surface of the base member 198. The cut and transfer tool 196 (see FIG. 18) is urged into the body portion of a contact 30. The cut and transfer tool 196 is then further urged past the cutting blade 206 (see FIG. 17) on the die member 192 which severs the support member 38 from the body portion 32 of the contact 30 as shown in FIG. 19. The cut and transfer tool 196 continues to urge the body portion 32 of the contact 30 past the clamping members 228—228 and into the elongated slot 216 (see FIG. 20). The clamping members 228—228 slideably capture the contact 30 when it has reached the end of the slot 216.

Figure 22:
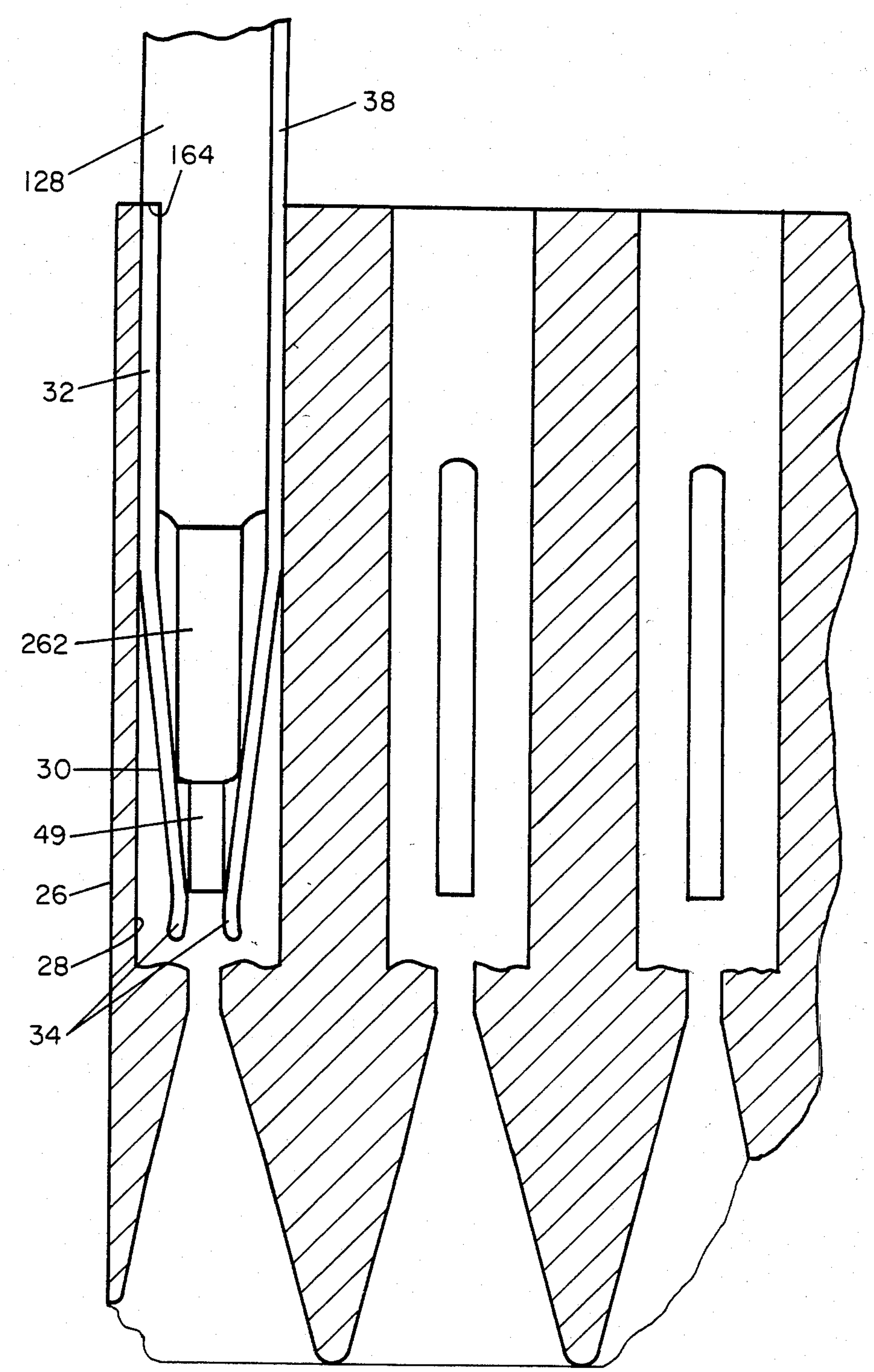

The punch 128 is then urged downward (see FIGS. 21 and 22) to insert the end 262 thereof into the contact 30 to spread the tines 34—34 thereof apart. The downward movement of the punch 128 causes a ridge 164 (see FIG. 22) thereon to contact one side of the body portion 32 as the tines 34—34 are moved further apart. Continued downward movement of the punch 128 overcomes the frictional forces of the clamping members 228—228 causing the contact 30 to exit the bottom 222 of the base member 198 and be inserted into a cavity 28 in a connector housing 26 as shown in FIGS. 15 and 22. The opened duck-bill tines 34—34 straddle the opposed ribs 49—49 within the cavity 28. The punch 128 is then withdrawn leaving the contact with the tines 34—34 held apart by the ribs 49—49 with the tail 38 projecting upwardly from the connector housing 26. The connector housings 26—26 are repetitively indexed and the insertion steps are repeated as contacts 30—30 are inserted into cavities 28—28 by multiple heads 80—80.

Figure 24:
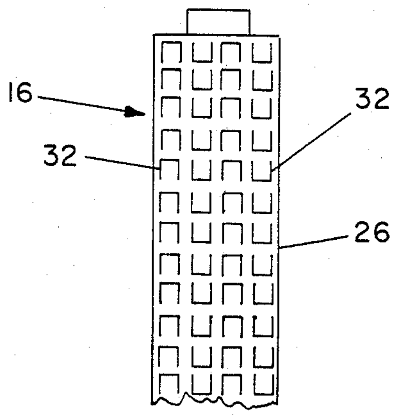
FIG. 24 is a schematic top view of a connector depicting an arrangement of contacts therein.

The above contact insertion operation is simultaneously accomplished by each insertion head 80. Thus, in the exemplary machine 50 depicted in FIGS. 6 and 7, contacts 30—30 are simultaneously inserted into a cavity 28 of a different connector housing 26. FIG. 24 schematically represents a connector 16 having four rows of contacts 30—30 wherein the "U" shaped body portion 32 of the contacts in adjacent rows face in opposite directions. By alternating the contact positions in the connector housing 26, the tails 38 will be offset on 0.0625 inch centers on adjacent rows, thus increasing the density of the connections that can be made to the PWB 10.

Accordingly, the contacts 30—30 would be sequentially inserted in the first row and the adjacent row skipped and the next row sequentially filled until every other row in all the connectors in the tray 68 has contacts in the apertures 28. The circular plate 62 is then rotated 180° and the above insertion sequence repeated to fill the empty rows of apertures. Once all the apertures have been filled with contacts the insertion heads 80—80 are deactivated, the superstructure unlocked and moved upward and the tray 68 removed. A new tray 68 of connectors 16—16 may be placed on the X, Y, $\theta$ table 54 and the foregoing steps repeated.

Although the exemplary embodiment describes the use of four insertion heads 80—80 simultaneously inserting contacts 30—30 into connectors 16—16 located in four different quadrants or sections of the tray of housings it should be clear that different numbers of heads can be used wherein that number is a multiple of two.

It is to be understood that the embodiments described herein are merely illustrative of the principles of the invention. Various modifications may be made thereto by persons skilled in the art which may embody the principles of the invention and fall within the spirit and scope thereof.

What is claimed is:

1. A method of inserting elongated contacts into cavities in connector housings, the method comprising the steps of:
   - positioning the housings in a planar array on an indexable table;
   - simultaneously indexing a plurality of strips of contacts past a respective plurality of contact insertion heads;
   - simultaneously activating the insertion heads to insert a contact from each strip into a cavity of a different connector housing in the array; and
   - continuously indexing and rotating the array of connector housings and inserting contacts into cavities therein until contacts have been inserted into predetermined cavities of the connector housings.

2. A method of inserting elongated contacts into a multitude of connector housings located in a tray having n sections, the housings having a plurality of contact receiving cavities therein, comprising:

(a) positioning the tray with the housings therein on a movable table under a superstructure containing n contact insertion heads;

(b) simultaneously urging a contact into a cavity of one housing in each section;

(c) sequentially inserting contacts into alternate rows of connector cavities to fill half the rows of all the connector housings in the tray;

(d) rotating the tray 180° and repeating steps (b) and (c) to insert contacts in predetermined connector cavities; and (e) removing the tray with from the table.

3. The method as set forth in claim 2, wherein n is a multiple of two.

4. A machine for inserting elongated contacts into cavities in a planar array of connector housings, comprising:

a superstructure;

a plurality of contact insertion heads located on said superstructure and positioned proximate the planar array of connector housings;

means operatively associated with said superstructure for simultaneously indexing each of a plurality of strips of contacts proximate to a respective plurality of insertion heads;

means operatively associated with said indexing means for simultaneously activating the heads to urge a contact from each strip into a cavity of a different connector housing in the array; and means operatively associated with said activating means for continuously indexing the array of connector housings to insert contacts into cavities therein until contacts have been inserted into predetermined cavities of the respective connector housings.

* * * * *